310-334 SR CROSS REFERENCE SEARCH ROOM
XR 3,234,482 9008 ✓
X 89213

STABILIZED ULTRASONIC AMPLIFIER

Filed April 23, 1963

INVENTORS J. H. ROWEN
D. L. WHITE
BY Rez M. Porter Jr.
ATTORNEY

3234482
CR IN 330/5.5

3,234,482

STABILIZED ULTRASONIC AMPLIFIER

John H. Rowen, Florham Park, and Donald L. White, Mendham, N.J., assignors to Bell Telephone Laboratories, Incorporated, New York, N.Y., a corporation of New York Filed Apr. 23, 1963, Ser. No. 275,059
6 Claims. (Cl. 330—35)

Figure 1:
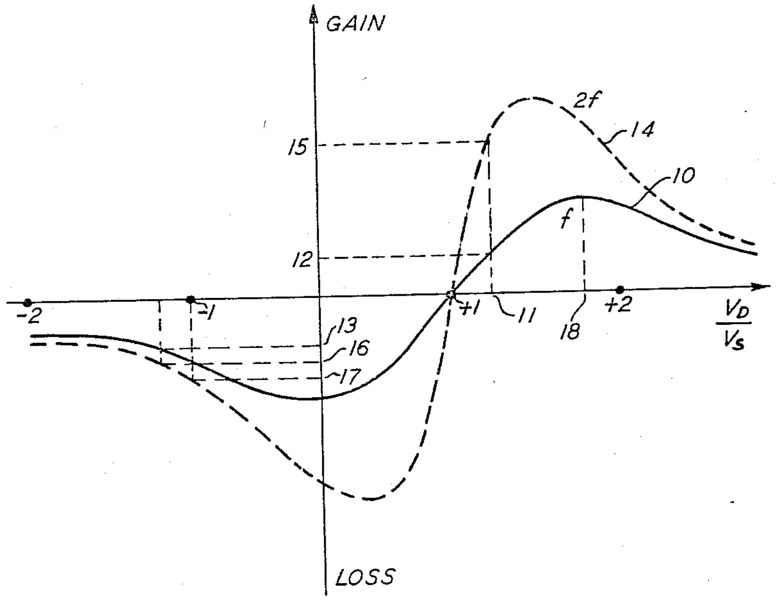

This invention relates to solid state acoustical or ultrasonic amplifiers of the type disclosed in United States Patent 3,173,100, issued March 9, 1965, to applicant White hereof, and more particularly to means for stabilizing said amplifier over a very broad band of frequencies.

As disclosed in this copending application, an acoustic wave propagating through a high resistivity piezoelectric semiconductor can be influenced through its interaction with free charge carriers in the semiconductor which are bunched by the piezoelectric field and caused to drift under the influence of an external D.-C. bias. These charge carriers are the electrons in N-type semiconductive material or holes in P-type semiconductive materials. More particularly, if the conditions are such that the average drift velocity of the charge carriers is greater than the velocity of the acoustic wave, the acoustic wave grows in amplitude as it propagates. If, however, the electron velocity is less than the acoustic wave velocity, the acoustic wave is diminished.

A backward traveling wave, such as that produced by a reflection, has a negative velocity ratio that produces a loss. By appropriate adjustment as disclosed in detail in the aforementioned application, the forward gain can be made substantial over a given band of frequencies. At the same time the backward loss over this band will in general be less than the forward gain with the result that the amplifier will not be stable. Obviously, if the round-trip gain expressed in decibels is not less than zero, reflections at the ends of the amplifier could cause the amplifier to break into spontaneous oscillations. Moreover, it has been recognized that because of the unique forward and backward gain characteristics as functions of frequency, the above-described stability usually cannot be attained at all frequencies in a uniform structure. As will be developed in more detail hereinafter, when the backward loss at some frequency becomes less than the forward gain at that frequency, the amplifier breaks into spontaneous oscillations that prove harmful to its proper operation even at those frequencies for which the amplifier is superficially stable.

It is, therefore, an object of the present invention to stabilize solid state acoustical amplifiers.

It is a more specific object to introduce a backward loss to solid state acoustical amplifiers that is greater at all frequencies than the forward gain at all frequencies.

In accordance with the invention it has been recognized that if a piezoelectric section is adjusted so that the charge carrier velocity is substantially equal to the forward wave velocity there will be neither gain nor loss in the forward direction at any frequency. The backward loss, however, can be made large at all frequencies by selecting the length of the section. When such an isolating section is integrally formed with an amplifying section proportioned to produce a large forward gain at the desired operating frequency, the total backward loss for both sections may be made large enough to offset the forward gain of the amplifying section at every frequency. Stability at every frequency is thus achieved.

A particular feature of the invention resides in the integral nature of the sections. In particular, a single crystal having two portions is employed. One portion has its resistivity, biasing field, illumination, or a combination of these parameters adjusted to produce the desired forward gain and the other has similar parameters adjusted to produce approximately zero forward gain and the desired reverse loss. The absence of an interface between them prevents reflections.

These and other objects and features, the nature of the present invention and its various advantages, will appear more fully upon consideration of the specific illustrative embodiments shown in the accompanying drawings and described in detail in the following explanation of these drawings.

Figure 2:
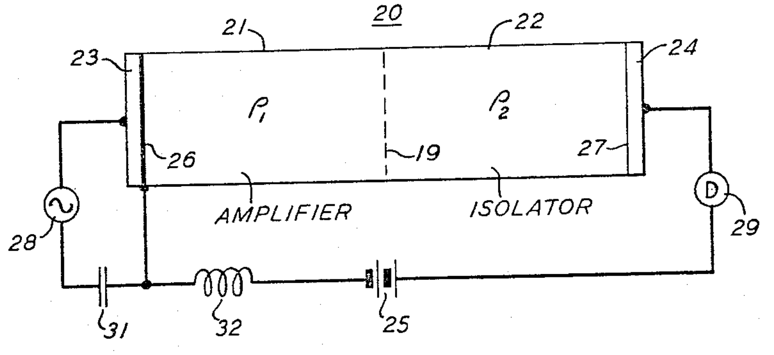

In the drawings:

FIG. 1 is a plot of the gain or loss versus the ratio of the average carrier drift velocity to the velocity of sound for a given ultrasonic amplifier under different frequency conditions; and FIG. 2 is a schematic view of an acoustic wave amplifier constructed in accordance with the teachings of the invention.

Referring more particularly to FIG. 1, the gain or loss versus relative velocity characteristic of a solid state amplifier is shown by way of illustration. This characteristic is described in more detail in the abovementioned copending application along with the mathematical analysis underlying it. For the purpose of the present disclosure it need be only noted that characteristic 10 illustrates the preformance of an operating frequency $f$ for various ratios of drift velocity $V_D$ to sound velocity $V_S$. In the region representing forward propagation where $V_D$ is positive with respect to and exceeds $V_S$, that is, $V_D/V_S>1$, amplification occurs; in the region where $V_D$ is positive with respect to and is less than $V_S$, that is, $0<V_D/V_S<1$, loss occurs; and in the region where the direction of the wave propagation is opposite to that of the drift velocity of the electrons, that is, $V_D/V_S<0$, loss occurs for all ratios.

It is therefore possible to choose an operating point such as 11 for which the gain 12 of the forward wave at the frequency $f$ is less than the loss 13 of the backward wave. Theoretically, the amplifier is stable at the frequency $f$. However, applicants have recognized that since the gain increases with frequency very much more rapidly than the loss, there will usually be a higher frequency for which the amplifier is unstable. This difficulty is illustrated on FIG. 1 by the characteristic 14 showing a typical gain characteristic at a frequency $2f$. Note that for operating point 11, the forward gain has now increased to 15 over that for the frequency $f$ while the backward loss increased to the smaller amount 16. Thus, any disturbance in the system, such as thermal noise, at the frequency $2f$ will rapidly build up a spontaneous oscillation which would mask any useful effect at the frequency $f$. For this reason a practical amplifier must suppress oscillation at every frequency including those well outside the desired operating band.

Note now that for the operating point $$\frac{V_D}{V_S}=1$$

representing the condition where the drift velocity of the electrons is equal to and in the same direction as the velocity of the sound, there is neither gain nor loss at any frequency. Since at every frequency some loss such as 17 is exhibited to the backward wave when $$\frac{V_D}{V_S}=-1$$

the reverse loss will always exceed the forward gain of zero. This operating point is the only one at which this is true for even at ratios only slightly greater than one, there will usually be large gain at some very high frequency.

FIG. 2 illustrates schematically a stabilized amplifier utilizing the foregoing principles of the invention. Body 20 comprises a single member, preferably a single crystal, having two portions 21 and 22 both of high resistivity, piezoelectric, semiconductive material of one of the compositions described as suitable in the above-mentioned copending application. Specifically, these materials include ones from Group III–V such as gallium arsenide, gallium phosphide or indium arsenide, or from Group II–VI such as cadmium sulfide, cadmium selenide, cadmium telluride, zinc oxide or zinc selenide. To each end of body 20 are attached ultrasonic transducers 23 and 24. Transducer 23 converts the electrical signals from source 28 into acoustical vibrations for travel down body 20 to transducer 24 which converts the acoustical energy into electrical signals to be delivered to utilizing device 29. These components are all conventional in the art and no further consideration need be given to them. It should be appreciated that an acoustic signal may be injected directly into body 30, thus eliminating transducer 23, or that transducer 24 may be eliminated if the desired output is an acoustic signal. Thus, the device illustrated in FIG. 1 is effectively an electromagnetic signal amplifier although the amplification mechanism utilizes an acoustic wave.

The direct-current field which couples with the piezoelectric field generated by the acoustic signal is impressed from a source 25 substantially parallel to the direction of ultrasonic propagation between transducers 23 and 24 and through both sections of body 20. If source 25 is connected between ohmic contacts 26 and 27 which also serve as the back contacts of transducers 23 and 24, respectively, the direct current is isolated from source 28 by capacitor 31 in series with source 28 and inductor 32 in series with source 25. If separate contacts are employed, adequate isolation is achieved by insulating the contacts from each other.

The present invention is primarily concerned with the relative nature of portions 21 and 22 of body 20. Thus portion 21 of body 20 comprises an amplifier section of length $l_{21}$ and resistivity $p_{21}$ and portion 22 comprising an isolating section of length $l_{22}$ and resistivity $p_{22}$ less than $p_{21}$ by an amount to be defined hereinafter. Sections 20 and 21 are preferably formed integrally from a single crystal of material and thus make intimate contact along the interface 19 which need not be a sharply defined interface. The differing resistivities of the sections may be produced in several ways each of which is familiar to the semiconductor art. For example, the higher resistivity material of section 21 may be grown or deposited by an epitaxial process, hydrothermal synthesis, flux growth or an equivalent process upon the lower resistivity material of section 22. The higher resistivity of the deposited material may be obtained also in several ways. For example, the material from which section 21 is formed may be of higher purity than that of section 22 so that fewer current carriers are present in section 21. Alternatively, the current carriers in the material of section 21 may be compensated by doping with other impurities of the types which are known to trap or compensate the current carriers of the original material. Alternatively, the differing resistivities of the sections may be obtained by adding a desired amount of either a compensating material or a conductive impurity material to different parts of an originally uniform member by a diffusion process. Further details of all these processes may be found in the copending application of applicant White Serial No. 208,185, filed July 3, 1962. Alternative control employing photoconductive materials will be described hereinafter.

Regardless of the process by which it is formed, the parameters of amplifying section 21 are such that the ratio of the carrier drift velocity in portion 21 to the velocity of sound in portion 21 or $V_{D_{21}}/V_{S_{21}}$ is greater than 1 and corresponds to that represented by some operating point such as 11 on FIG. 1. Similarly, the parameters of isolating portion 22 are such that the carrier drift velocity in portion 22 equals the sound velocity therein or $V_{D_{22}}=V_{S_{22}}$. Since the acoustic velocity is approximately equal in both sections $V_{S_{21}}=V_S$, the different velocity ratios are obtained by choice of the drift velocities $V_{D_{21}}$ and $V_{D_{22}}$ in the respective sections. In either section drift velocity is dependent upon the material and the magnitude of the direct-current field as follows:

$$V_D=\mu E' \quad (1)$$

where $\mu$ is the mobility of the majority carrier in the semi-conductor in centimeters$^2$/volt-seconds, and $E'$ is the strength of the direct-current field in volts per cm. in the particular section in the direction of the propagation of the acoustic wave. $E'$ is, in turn, dependent upon the relative resistivities of the sections.

Thus, if a steady voltage V is impressed across both sections the electric field will divide between the sections in direct proportion to these resistivities. Thus, if the mobilities in the two sections are equal, $$\frac{E'_{21}}{E'_{22}}=\frac{p_{21}}{p_{22}}=\frac{V_{D_{21}}}{V_{D_{22}}} \quad (2)$$

Therefore, the resistivity of the isolating section 22 becomes $$p_{22}=\frac{V_{D_{22}}}{V_{D_{21}}}p_{21} \quad (3)$$

and since $V_{D_{22}}$ equals $V_S$ as specified above, $$p_{22}=\frac{V_S}{V_{D_{21}}}p_{21} \quad (4)$$

A stabilized amplifier according to the invention is designed by first selecting the operating ratio $V_{D_{21}}/V_S$ and the resistivity $p_{21}$ taking into account the forward gain desired and the operating frequency in accordance with the principles outlined in the above-mentioned copending application. Point 11 on FIG. 1 represents one such operating point which produces a forward gain less than the maximum obtainable gain at the frequency $f$. Point 18, on the other hand, represents an operating point for which maximum forward gain at the frequency $f$ is obtained. In either case the ratio of $V_{D_{21}}/V_S$ is some value greater than one. The resistivity $p_{22}$ of isolating section 22 is then determined by Equation 4 and will be seen to be less than $p_{21}$ by a factor $V_S/V_{D_{21}}$, the reciprocal of the operating ratio. The length $l_{21}$ is selected to produce the required total forward gain and the length $l_{22}$ is increased until the total backward loss exceeds this total forward gain. The required applied voltage V may then be expressed, $$V=\frac{V_{D_{21}}}{\mu p_{21}}(l_{21}p_{21}+l_{22}p_{22}) \quad (5)$$

or $$V=\frac{V_{D_{22}}}{\mu p_{22}}(l_{21}p_{21}-l_{22}p_{22}) \quad (6)$$

It is seen from Equation 2 that the drift velocity may be determined for a given section by either its electric field or its resistivity. While the preferred embodiment of the invention contemplates a single voltage applied across two sections of different resistivity, the use of multiple electrodes and separately applied voltages for the two sections represents an alternative to providing sections of different resistivity. On the other hand, while controlling of the impurity content of the materials of the sections appears to be a preferred way of controlling their resistivities, it should be recalled that some semiconductors, for instance GaAs and CdS, are photosensitive. That is, their resistivity varies with the intensity of incident illumination. Thus, an appropriate light source, with which the art is well acquainted, may be employed to vary the resistivity of one section with respect to the other, or with separate light sources having different conditions of illumination the resistivities of both sections may be modified. A more thorough treatment of the variation of resistivity with illumination in piezoelectric semiconductors will be found in United States Patent 3,145,354, issued August 18, 1964, to A. R. Hutson.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. An ultrasonic amplifier comprising a piezoelectric semiconductive body, means for propagating an ultrasonic wave through said body, means for impressing a direct-current voltage across said body in a direction parallel to said ultrasonic wave propagation, said body having at least two portions of different resistivity, the resistivity in one portion being that for which current carriers in said material drift under the influence of said voltage at a velocity substantially equal to the velocity of said ultrasonic wave propagation.

2. An ultrasonic wave amplifier comprising a piezoelectric semiconductor body having at least two distinct portions, means for propagating an ultrasonic wave through said body thereby generating a significant piezoelectric field, means including a source of direct-current bias for establishing a steady electric field having different values in said two portions, said electric field having a magnitude and direction in each of said portions such that the drift velocity of the carriers responsive to said electric field has a velocity component in the direction of ultrasonic wave propagation in said one portion which is substantially greater than the velocity of the ultrasonic wave and in the other of said portions such that said velocities are substantially equal.

3. The amplifier according to claim 2 wherein said two portions have different resistivities and wherein a single voltage is impressed across both portions.

4. The amplifier according to claim 3 wherein the ratio of said different resistivities to each other equals the ratio of said drift velocity to said ultrasonic velocity in said one portion.

5. The amplifier according to claim 2 wherein the semiconductor is selected from the group consisting of GaAs, GaP, ZnO, CdS, InAs, ZnS, CdTe and CdSe.

6. An ultrasonic amplifier comprising a piezoelectric semiconductive body, means for propagating an ultrasonic wave through said body, means including a source of direct-current bias for establishing a steady electric field in said body, said body having two distinct portions of different resistivity, the resistivity $p_1$ in one portion being that for which the drift velocity $V_D$ of the carriers responsive to said field has a component in the direction of ultrasonic wave propagation which is greater than the velocity $V_S$ of the ultrasonic wave, the resistivity $p_2$ in the other portion being substantially equal to $p_1 V_S / V_D$.

No references cited.

ROY LAKE, *Primary Examiner.*